US012607671B2

(12) United States Patent
Chien et al.

(10) Patent No.: US 12,607,671 B2
(45) Date of Patent: Apr. 21, 2026

(54) RF TESTING METHOD AND TESTING SYSTEM

(71) Applicant: MEDIATEK INC., Hsinchu (TW)

(72) Inventors: Jung-Yin Chien, Hsinchu (TW);
Po-Yen Tseng, Hsinchu (TW); Pin-Lin Huang, Hsinchu (TW); Wen-Chih Chen, Hsinchu (TW)

(73) Assignee: MEDIATEK INC., Hsinchu City (TW)

( * ) Notice: Subject to any disclaimer, the term of this patent is extended or adjusted under 35 U.S.C. 154(b) by 490 days.

(21) Appl. No.: 18/180,243

(22) Filed: Mar. 8, 2023

(65) Prior Publication Data

US 2024/0125849 A1       Apr. 18, 2024

Related U.S. Application Data

(60) Provisional application No. 63/379,460, filed on Oct. 14, 2022.

(51) Int. Cl.
H04B 17/00 (2015.01)
G01R 31/28 (2006.01)
G01R 31/3163 (2006.01)

(52) U.S. Cl.
CPC ..... G01R 31/3163 (2013.01); G01R 31/2834 (2013.01); H04B 17/0085 (2013.01)

(58) Field of Classification Search
CPC .... H04B 17/15; H04B 17/0065; H04B 17/29; H04B 17/0085; H04W 24/06; H04W 72/23; H04W 24/00; H04L 43/50
USPC ........................................................ 375/224
See application file for complete search history.

(56) References Cited

U.S. PATENT DOCUMENTS

| | | | |
|---|---|---|---|
| 2007/0061658 A1* | 3/2007 | Hsu ................... | G01R 31/31716 |
| | | | 714/742 |
| 2008/0172588 A1* | 7/2008 | Olgaard ................. | H04L 43/50 |
| | | | 714/742 |
| 2017/0010304 A1* | 1/2017 | Jang ................. | G01R 31/31926 |
| 2018/0034563 A1 | 2/2018 | Foegelle | |
| 2019/0219629 A1* | 7/2019 | Schnizler ........... | G01R 31/2813 |

(Continued)

FOREIGN PATENT DOCUMENTS

TW          M478973 U       5/2014

OTHER PUBLICATIONS

Chinese language office action dated Oct. 22, 2024, issued in application No. TW 112126550.

*Primary Examiner* — Khai Tran
(74) *Attorney, Agent, or Firm* — McClure, Qualey & Rodack, LLP

(57)          ABSTRACT

An RF testing method is applied between a testing instrument and multiple devices under test at least including a first DUT and a second DUT. The testing instrument includes a signal generator and a signal analyzer. A sync signal is sent to the testing instrument and the first DUT, so that the first DUT occupies the signal generator to receive a testing signal from the signal generator. The first DUT sends an uplink signal to the signal analyzer based on the testing signal to occupy the signal analyzer for signal analysis at a first point in time. The sync signal is sent to the testing instrument and the second DUT, so that the second DUT occupies the signal generator to receive the testing signal from the signal generator at a second point in time. The first point in time is parallel to the second point in time.

20 Claims, 9 Drawing Sheets

(56) References Cited

U.S. PATENT DOCUMENTS

| | | | |
|---|---|---|---|
| 2023/0111796 A1* | 4/2023 | Kannampalli | G06F 11/2263 |
| | | | 714/26 |
| 2024/0036112 A1* | 2/2024 | Cruz | H04L 43/50 |
| 2024/0385213 A1* | 11/2024 | Seeger | G01R 1/0416 |

* cited by examiner

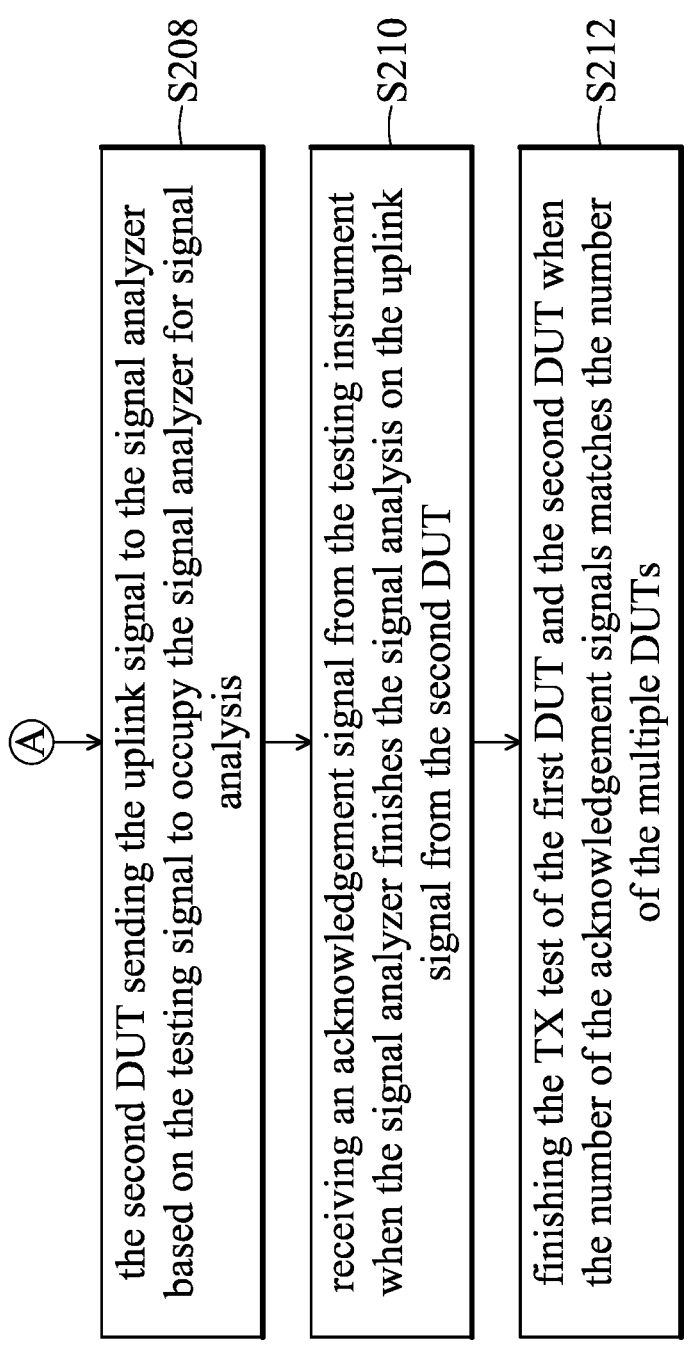

the second DUT sending the uplink signal to the signal analyzer based on the testing signal to occupy the signal analyzer for signal analysis —S208 receiving an acknowledgement signal from the testing instrument when the signal analyzer finishes the signal analysis on the uplink signal from the second DUT —S210 finishing the TX test of the first DUT and the second DUT when the number of the acknowledgement signals matches the number of the multiple DUTs —S212

FIG. 2B

S200 establishing communication with the testing instrument after the testing instrument receives the first sync signal — S300 establishing communication with the first DUT after the first DUT receives the first sync signal; and — S302 enabling the signal generator of the testing instrument to send the testing signal to the first DUT — S304

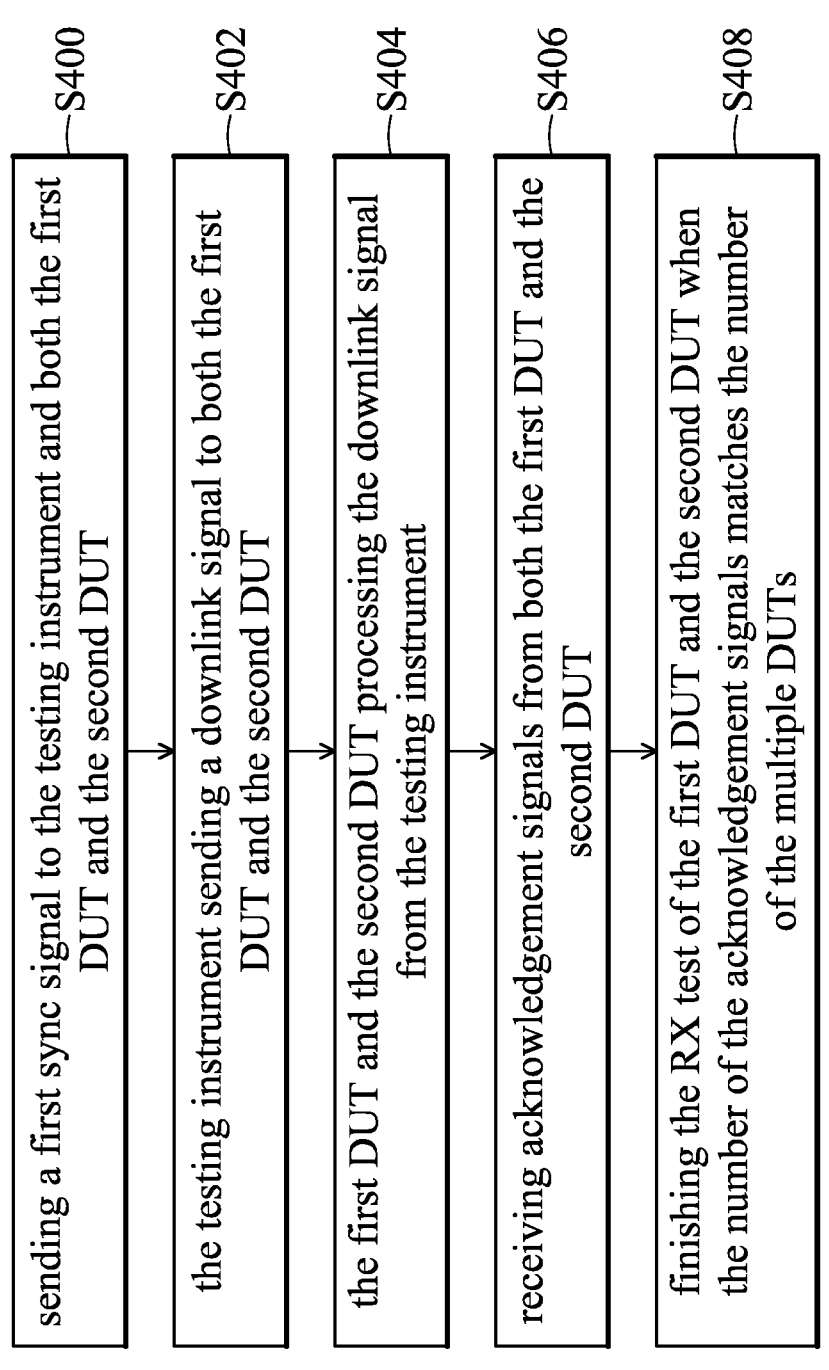

sending a first sync signal to the testing instrument and both the first DUT and the second DUT ⎯S400 the testing instrument sending a downlink signal to both the first DUT and the second DUT ⎯S402 the first DUT and the second DUT processing the downlink signal from the testing instrument ⎯S404 receiving acknowledgement signals from both the first DUT and the second DUT ⎯S406 finishing the RX test of the first DUT and the second DUT when the number of the acknowledgement signals matches the number of the multiple DUTs ⎯S408

FIG. 4 the first DUT finishing processing the downlink signal at a first point in time —S600 the second DUT finishing processing the downlink signal at a second point in time, the second point in time is later than the first point in time —S602 sending a second sync signal to the testing instrument and both the first DUT and the second DUT after the second point in time —S604

RF TESTING METHOD AND TESTING SYSTEM

CROSS REFERENCE TO RELATED APPLICATIONS

This application claims the benefit of U.S. Provisional Application No. 63/379,460, filed Oct. 14, 2022, the entirety of which is incorporated by reference herein.

BACKGROUND OF THE INVENTION

Field of the Invention

The present invention relates to an RF testing method, and, in particular, to a method to perform RF testing on multi-DUTs in parallel.

Description of the Related Art

In current RF calibrations and final test for multiple devices under test (DUTs), the RF calibrations are done in sequence. That is, DUTs occupy all testing instrument resource in sequence. On the other hand, the testing instrument receives more commands in one to save execution time. Many commands are merged into a command set, and the command set is used to run a final test to reduce the execution time. How to use the resources of the testing instrument more effectively has become an important issue.

BRIEF SUMMARY OF THE INVENTION

An embodiment of the present invention provides an RF testing method for a TX test. The RF testing method is applied between a testing instrument and multiple devices under test at least including a first DUT and a second DUT. The testing instrument includes a signal generator and a signal analyzer. The RF testing method includes the stages detailed in the following paragraph. A first sync signal is sent to the testing instrument and the first DUT, so that the first DUT occupies the signal generator to receive a testing signal from the signal generator. The first DUT sends an uplink signal to the signal analyzer based on the testing signal to occupy the signal analyzer for signal analysis at a first point in time. The second sync signal is sent to the testing instrument and the second DUT, so that the second DUT occupies the signal generator to receive the testing signal from the signal generator at a second point in time. The first point in time is parallel to the second point in time.

The RF testing method further includes the stages detailed in the following paragraph. The second DUT sends the uplink signal to the signal analyzer based on the testing signal to occupy the signal analyzer for signal analysis at a third point in time. A third sync signal is sent to the testing instrument and the first DUT, so that the first DUT occupies the signal generator to receive the testing signal from the signal generator at a fourth point in time. The third point in time is parallel to the fourth point in time, and the third point in time is later than the first point in time.

According to the RF testing method described above, the first sync signal includes frequency information of the uplink signal from the first DUT. The second sync signal includes frequency information of the uplink signal from the second DUT.

The RF testing method further includes the stages detailed in the following paragraph. The testing instrument sends a first acknowledgement signal when the signal analysis of the uplink signal from the first DUT is pass. The testing instrument sends a second acknowledgement signal when the signal analysis of the uplink signal from the second DUT is pass.

The RF testing method further includes the stages detailed in the following paragraph. A fourth sync signal is sent to the testing instrument and the first DUT after the signal analysis of the uplink signal from the second DUT is pass when the signal analysis of the uplink signal from the first DUT is failed.

The RF testing method further includes the stages detailed in the following paragraph. Acknowledgement signals are received from the testing instrument when the signal analyzer finishes the signal analysis on uplink signals from the multiple DUTs. The number of acknowledgement signals is counted. The TX test of the multiple DUTs is finished when the number of acknowledgement signals matches the number of multiple DUTs.

According to the RF testing method described above, the step of sending the first sync signal to the testing instrument and the first DUT includes the stages detailed in the following paragraph. Communication with the testing instrument is established after the testing instrument receives the first sync signal. Communication with the first DUT is established after the first DUT receives the first sync signal. The signal generator of the testing instrument is enabled to send the testing signal to the first DUT.

An embodiment of the present invention provides an RF testing method for an RX test. The RF testing method is applied between a testing instrument and multiple devices under test (DUTs) at least comprising a first DUT and a second DUT. The testing instrument includes a signal generator and a signal analyzer. The RF testing method includes the stages detailed in the following paragraph. A first sync signal is sent to the testing instrument and both the first DUT and the second DUT. The testing instrument sends a downlink signal to both the first DUT and the second DUT. The first DUT and the second DUT process the downlink signal from the testing instrument. Acknowledgement signals are received from both the first DUT and the second DUT.

The RF testing method further includes the stages detailed in the following paragraph. The acknowledgement signals are received from the multiple DUTs when the multiple DUTs finish processing the downlink signal from the testing instrument. The number of acknowledgement signals is counted. The RX test of the multiple DUTs is finished when the number of acknowledgement signals matches the number of multiple DUTs.

The RF testing method further includes the stages detailed in the following paragraph. The first DUT finishes processing the downlink signal at a first point in time. The second DUT finishes processing the downlink signal at a second point in time. The second point in time is later than the first point in time. A second sync signal is sent to the testing instrument and both the first DUT and the second DUT after the second point in time.

According to the RF testing method described above, the step of sending the first sync signal to the testing instrument and both the first DUT and the second DUT includes the stages detailed in the following paragraph. Communication with the testing instrument is established after the testing instrument receives the first sync signal. Communication with the first DUT is established after the first DUT receives the first sync signal. Communication with the second DUT is established after the second DUT receives the first sync signal. The signal generator of the testing instrument is enabled to send the downlink signal to both the first DUT and the second DUT.

In addition, an embodiment of the present invention provides a testing system. The testing system includes a testing instrument, multiple devices under test (DUTs), and a host device. The testing instrument includes a signal generator and a signal analyzer. The multiple DUTs at least include a first DUT and a second DUT. The first DUT and the second DUT are electrically connected to the testing instrument. The host device is electrically connected to the testing instrument and the multiple DUTs. The host device sends a first sync signal to the testing instrument and the first DUT, so that the first DUT occupies the signal generator to receive a testing signal from the signal generator. The first DUT sends an uplink signal to the signal analyzer based on the testing signal to occupy the signal analyzer for signal analysis at a first point in time. The host device sends a second sync signal to the testing instrument and the second DUT, so that the second DUT occupies the signal generator to receive the testing signal from the signal generator at a second point in time. The first point in time is parallel to the second point in time.

According to the testing system described above, the second DUT sends the uplink signal to the signal analyzer based on the testing signal to occupy the signal analyzer for signal analysis at a third point in time. The host device sends a third sync signal to the testing instrument and the first DUT, so that the first DUT occupies the signal generator to receive the testing signal from the signal generator at a fourth point in time. The third point in time is parallel to the fourth point in time, and the third point in time is later than the first point in time.

According to the testing system described above, the testing instrument sends a first acknowledgement signal when the signal analysis of the uplink signal from the first DUT is pass. The testing instrument sends a second acknowledgement signal when the signal analysis of the uplink signal from the second DUT is pass.

According to the testing system described above, the first sync signal includes frequency information of the uplink signal from the first DUT. The second sync signal includes frequency information of the uplink signal from the second DUT.

According to the testing system described above, when the signal analysis of the uplink signal from the first DUT is failed, the host device sends a fourth sync signal to the testing instrument and the first DUT after the signal analysis of the uplink signal from the second DUT is pass.

According to the testing system described above, the host device sends a fifth sync signal to the testing instrument and both the first DUT and the second DUT. The testing instrument sends a downlink signal to both the first DUT and the second DUT. The first DUT and the second DUT process the downlink signal from the testing instrument. The host device receives an acknowledgement signal from both the first DUT and the second DUT.

According to the testing system described above, the first DUT finishes processing the downlink signal at a fifth time point. The second DUT finishes processing the downlink signal at a sixth time point, the sixth time point is later than the fifth time point. The host device sends a sixth sync signal to the testing instrument and both the first DUT and the second DUT after the sixth time point.

BRIEF DESCRIPTION OF THE DRAWINGS

The present invention can be more fully understood by reading the subsequent detailed description and examples with references made to the accompanying drawings, wherein:

FIG. 2A and FIG. 2B are flow charts of the RF testing method for a TX test in accordance with some embodiments of the present invention.

FIG. 4 is a flow chart of the RF testing method for a RX test in accordance with some embodiments of the present invention.

DETAILED DESCRIPTION OF THE INVENTION

Figure 1:
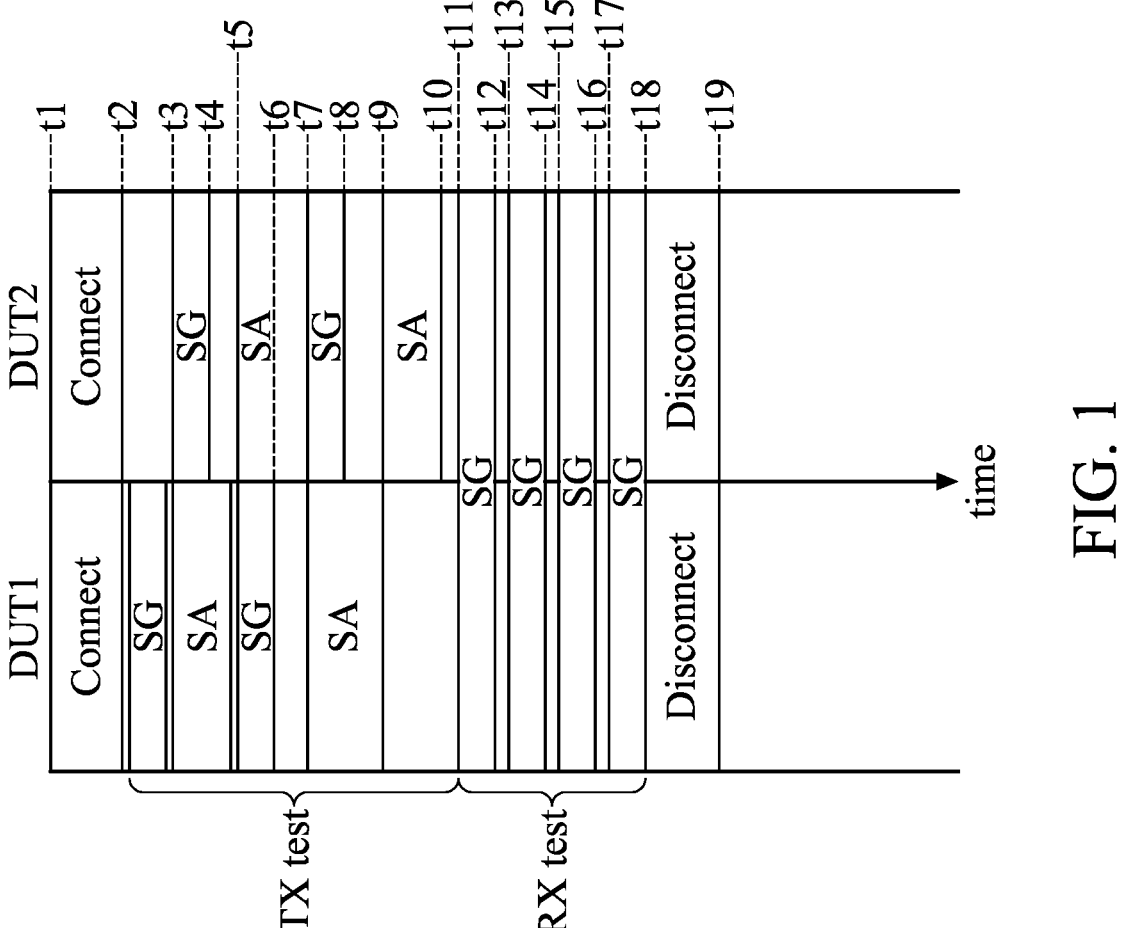
FIG. 1 is a timing sequence diagram of an RF testing method in accordance with some embodiments of the present invention.

In order to make the above purposes, features, and advantages of some embodiments of the present invention more comprehensible, the following is a detailed description in conjunction with the accompanying drawing.

Certain terms are used throughout the description and following claims to refer to particular components. As one skilled in the art will understand, electronic equipment manufacturers may refer to a component by different names. This document does not intend to distinguish between components that differ in name but not function. It is understood that the words "comprise", "have" and "include" are used in an open-ended fashion, and thus should be interpreted to mean "include, but not limited to . . . ". Thus, when the terms "comprise", "have" and/or "include" used in the present invention are used to indicate the existence of specific technical features, values, method steps, operations, units and/or components. However, it does not exclude the possibility that more technical features, numerical values, method steps, work processes, units, components, or any combination of the above can be added.

The directional terms used throughout the description and following claims, such as: "on", "up", "above", "down", "below", "front", "rear", "back", "left", "right", etc., are only directions referring to the drawings. Therefore, the directional terms are used for explaining and not used for limiting the present invention. Regarding the drawings, the drawings show the general characteristics of methods, structures, and/or materials used in specific embodiments. However, the drawings should not be construed as defining or limiting the scope or properties encompassed by these embodiments. For example, for clarity, the relative size, thickness, and position of each layer, each area, and/or each structure may be reduced or enlarged.

When the corresponding component such as layer or area is referred to as being "on another component", it may be directly on this other component, or other components may exist between them. On the other hand, when the component is referred to as being "directly on another component (or the variant thereof)", there is no component between them. Furthermore, when the corresponding component is referred to as being "on another component", the corresponding component and the other component have a disposition relationship along a top-view/vertical direction, the corresponding component may be below or above the other component, and the disposition relationship along the top-view/vertical direction is determined by the orientation of the device.

It should be understood that when a component or layer is referred to as being "connected to" another component or layer, it can be directly connected to this other component or layer, or intervening components or layers may be present. In contrast, when a component is referred to as being "directly connected to" another component or layer, there are no intervening components or layers present.

The electrical connection or coupling described in this disclosure may refer to direct connection or indirect connection. In the case of direct connection, the endpoints of the components on the two circuits are directly connected or connected to each other by a conductor line segment, while in the case of indirect connection, there are switches, diodes, capacitors, inductors, resistors, other suitable components, or a combination of the above components between the endpoints of the components on the two circuits, but the intermediate component is not limited thereto.

The words "first", "second", "third", "fourth", "fifth", and "sixth" are used to describe components. They are not used to indicate the priority order of or advance relationship, but only to distinguish components with the same name.

It should be noted that the technical features in different embodiments described in the following can be replaced, recombined, or mixed with one another to constitute another embodiment without departing from the spirit of the present invention.

FIG. 1 is a timing sequence diagram of an RF testing method in accordance with some embodiments of the present invention. The RF testing method in FIG. 1 is applied on two devices under test (DUTs), for example, a device DUT1 and a device DUT2, a testing instrument (not shown in FIG. 1), and a host device (not shown in FIG. 1). However, the present invention does not limit the number of DUTs. In some embodiments, the device DUT1 and the device DUT2 are electronic devices with the function of receiving and transmitting RF signals, for example, smart phones and tablets, but the present invention is not limited thereto. The testing instrument is electrically connected to the device DUT1 and the device DUT2 through coaxial cables, but the present invention is not limited thereto. The testing instrument is able to send downlink signals to the device DUT1 and the device DUT2 for the RX test in FIG. 1, and receive uplink signals from the device DUT1 and the device DUT2 for the TX test in FIG. 1. In some embodiments, the testing instrument includes a signal generator and a signal analyzer. The host device is electrically connected to the device DUT1, the device DUT2, and the testing instrument to control them for the TX test and the RX test in FIG. 1 by universal serial bus (USB) protocol, and/or universal asynchronous receiver/transmitter (UART) protocol, but the present invention is not limited thereto. In some embodiments, the host device is, for example, a desktop, a laptop, and a server, but the present invention is not limited thereto.

In some embodiments, the host device includes a processor to execute a testing program for controlling the testing instrument, the device DUT1, and the device DUT2 to complete the TX test and the RX test in FIG. 1.

As shown in FIG. 1, at time point t1, the host device detects that the device DUT1 and the device DUT2 are attached. Therefore, during time point t1 to time point t2, the host device establishes communication with the device DUT1, the device DUT2, and the testing instrument. In some embodiments, the host device establishes communication with the testing instrument before time point t1, but the present invention is not limited thereto. At time point t2, the host device has established communication with the device DUT1, the device DUT2, and the testing instrument successfully. At time point t2, the host device sends a first sync signal to the testing instrument and the device DUT1. After receiving the first sync signal from the host device, the signal generator of the testing instrument sends a testing signal to the device DUT1. During time point t2 and time point t3, which is marked as "SG" in FIG. 1, the device DUT1 receives the testing signal to occupy the signal generator of the testing instrument.

At time point t3, the device DUT1 sends an uplink signal to the signal analyzer of the testing instrument based on the testing signal to occupy the signal analyzer for signal analysis, which is marked as "SA" in FIG. 1. During time point t3 to time point t5, the signal analyzer analyzes the uplink signal from the device DUT1. In some embodiments, the first sync signal includes frequency information of the uplink signal sent by the device DUT1. Simultaneously, at time point t3, the host device sends a second sync signal to the testing instrument and the device DUT2. After receiving the second sync signal from the host device, the signal generator of the testing instrument sends the testing signal to the device DUT2. During time point t3 and time point t4, which is marked as "SG" in FIG. 1, the device DUT2 receives the testing signal from the testing instrument to occupy the signal generator of the testing instrument. In other words, during time point t3 and time point t4 in FIG. 1, the signal generator and the signal analyzer of the testing instrument are both occupied simultaneously, so that the resources of the testing instrument are fully utilized. In some embodiments, the signal analysis may include power detection of the uplink signal, deviation detection of the uplink signal, and cyclic redundancy check (CRC), but the present invention is not limited thereto.

At time point t5, the device DUT2 sends the uplink signal to the signal analyzer of the testing instrument based on the testing signal to occupy the signal analyzer for signal analysis. In some embodiments, the second sync signal includes frequency information of the uplink signal sent by the device DUT2. Simultaneously, at time point t5, the host device sends a third sync signal to the device DUT1 and the testing instrument. After receiving the third sync signal from the host device, the signal generator of the testing instrument sends the testing signal to the device DUT1. During time point t5 and time point t6, which is marked as "SG" in FIG. 1, the device DUT1 again receives the testing signal from the testing instrument to occupy the signal generator of the testing instrument. In other words, during time point t5 and time point t5 in FIG. 1, the signal generator and the signal analyzer of the testing instrument are both occupied simultaneously, so that the resources of the testing instrument are fully utilized. Furthermore, at time point t5, the testing instrument sends a first acknowledgement signal to the host device when the signal analysis of the uplink signal from the device DUT1 is pass.

During time point t5 to time point t7, the signal analyzer analyzes the uplink signal from the device DUT2. In some embodiments, the third sync signal includes frequency information of the uplink signal sent by the device DUT1. In some embodiments, the frequency information of the uplink signal included in the first sync signal is different from the frequency information of the uplink signal included in the third sync signal. In addition, the frequency information of the uplink signal included in the first sync signal is the same as the frequency information of the uplink signal included in the second sync signal, but the present invention is not limited thereto. At time point t7, the testing instrument sends a second acknowledgement signal to the host device when the signal analysis of the uplink signal from the device DUT2 is pass. Simultaneously, at time point t7, the host device sends a fourth sync signal to the device DUT2 and the testing instrument. After receiving the fourth sync signal from the host device, the signal generator of the testing instrument sends the testing signal to the device DUT2. During time point t7 and time point t8, which is marked as "SG" in FIG. 1, the device DUT2 receives the testing signal from the testing instrument to occupy the signal generator of the testing instrument. At time point t7, the device DUT1 sends the uplink signal to the signal analyzer of the testing instrument based on the testing signal to occupy the signal analyzer for signal analysis, which is marked as "SA" in FIG. 1. During time point t7 to time point t9, the signal analyzer analyzes the uplink signal from the device DUT1. That is, during time point t7 to time point t8, in FIG. 1, the signal generator and the signal analyzer of the testing instrument are both occupied simultaneously, so that the resources of the testing instrument are fully utilized.

At time point t9, the testing instrument sends a third acknowledgement signal to the host device when the signal analysis of the uplink signal from the device DUT1 is pass. Simultaneously, at time point t9, the device DUT2 sends the uplink signal to the signal analyzer of the testing instrument based on the testing signal to occupy the signal analyzer for signal analysis. At time point t10, the testing instrument sends a fourth acknowledgement signal to the host device when the signal analysis of the uplink signal from the device DUT2 is pass. In some embodiments, the fourth sync signal includes frequency information of the uplink signal sent by the device DUT2. In some embodiment, the frequency information of the uplink signal included in the second sync signal is different from the frequency information of the uplink signal included in the fourth sync signal. In addition, the frequency information of the uplink signal included in the third sync signal is the same as the frequency information of the uplink signal included in the fourth sync signal, but the present invention is not limited thereto. In some embodiments, when the signal analysis of the uplink signal from the device DUT1 is failed at time point t9, the host device sends another sync signal for retesting the device DUT1 to the testing instrument and the device DUT1 after the signal analysis of the uplink signal from the device DUT2 is pass at time point t10 (not shown in FIG. 1). In some embodiments, during time point t2 to time point t11, the host device performs the TX test on the device DUT1 and the device DUT2 in parallel. In some embodiments, the host device counts the number of acknowledgement signals received from multiple DUTs to determine whether to end up the testing. For example, in some embodiments of FIG. 1, when the host device receives two acknowledgement signals, the number of acknowledgement signals matches the number of multiple DUTs (for example, the device DUT1 and the device DUT2), the host device finishes the TX test on the device DUT1 and the device DUT2.

At time point t11, the host device sends a fifth sync signal to the testing instrument and both the device DUT1 and the device DUT2. After receiving the fifth sync signal from the host device, the signal generator of the testing instrument sends a downlink signal to both the device DUT1 and the device DUT2. In some embodiments, the fifth sync signal includes frequency information of the downlink signal from the testing instrument during time point t11 and time point t12. During time point t11 to time point t12, the device DUT1 and the device DUT2 process the downlink signal from the testing instrument. In some embodiment, the device DUT1 and the device DUT2 may measure the receiving sensitivity of the downlink signal, but the present invention is not limited thereto. In some embodiments, at time point t12, the host device receives the acknowledgement signals from the device DUT1 and the device DUT2 when the device DUT1 and the device DUT2 finish processing the downlink signal from the testing instrument. In some embodiments, the host device counts the number of acknowledgement signals from the device DUT1 and the device DUT2 to determine whether to send another sync signal to the device DUT1, the device DUT2, and the testing instrument, or to end up the testing. For example, at time point t12, the host device receives two acknowledgement signals, the number of acknowledgement signals matches the number of multiple DUTs (for example, the device DUT1 and the device DUT2). Then, the host device sends a sixth sync signal to the testing instrument and both the device DUT1 and the device DUT2 at time point t13.

After receiving the sixth sync signal from the host device, the signal generator of the testing instrument sends the downlink signal to both the device DUT1 and the device DUT2. In some embodiments, the sixth sync signal includes frequency information of the downlink signal from the testing instrument during time point t13 and time point t14. In some embodiments, the time interval between time point t12 and time point t13 may be a time delay setting by the host device, but the present invention is not limited thereto. During time point t13 to time point t14, the device DUT1 and the device DUT2 process the downlink signal from the testing instrument. In some embodiments, at time point t14, the host device receives the acknowledgement signals from the device DUT1 and the device DUT2 when the device DUT1 and the device DUT2 finish processing the downlink signal from the testing instrument. In some embodiments, the time interval between time point t14 and time point t15 may be a time delay setting by the host device, but the present invention is not limited thereto.

At time point t15, the host device sends a seventh sync signal to the testing instrument and both the device DUT1 and the device DUT2. After receiving the seventh sync signal from the host device, the signal generator of the testing instrument sends the downlink signal to both the device DUT1 and the device DUT2. In some embodiments, the seventh sync signal includes frequency information of the downlink signal from the testing instrument during time point t15 and time point t16. During time point t15 to time point t16, the device DUT1 and the device DUT2 process the downlink signal from the testing instrument. In some embodiments, at time point t16, the host device receives the acknowledgement signals from the device DUT1 and the device DUT2 when the device DUT1 and the device DUT2 finish processing the downlink signal from the testing instrument.

At time point t17, the host device sends a eighth sync signal to the testing instrument and both the device DUT1 and the device DUT2. After receiving the eighth sync signal from the host device, the signal generator of the testing instrument sends the downlink signal to both the device DUT1 and the device DUT2. In some embodiments, the eighth sync signal includes frequency information of the downlink signal from the testing instrument during time point t17 and time point t18. During time point t17 to time point t18, the device DUT1 and the device DUT2 process the downlink signal from the testing instrument. In some embodiments, at time point t18, the host device receives the acknowledgement signals from the device DUT1 and the device DUT2 when the device DUT1 and the device DUT2 finish processing the downlink signal from the testing instrument. In some embodiments, the time interval between time point t16 and time point t17 may be a time delay setting by the host device, but the present invention is not limited thereto.

At time point t18, the host device receives counts the acknowledgement signals from the device DUT1 and the device DUT2. The host device finishes the RX test on the device DUT1 and the device DUT2 when the number of acknowledgement signals matches the number of multiple DUTs. In some embodiments, the frequency information of the downlink signals included in the fifth sync signal, the sixth sync signal, the seventh sync signal, and the eighth sync signal is different from each other, but the present invention is not limited thereto. In some embodiments, during time point t11 to time point t18, the host device performs the RX test on the device DUT1 and the device DUT2 in parallel. During time point t18 and time point t19, since the TX test and the RX test on the device DUT1 and the device DUT2 are finished, the host device disconnects the communication between itself and the device DUT1, the communication between itself and the device DUT2, and the communication between itself and the testing instrument.

Figure 2A:
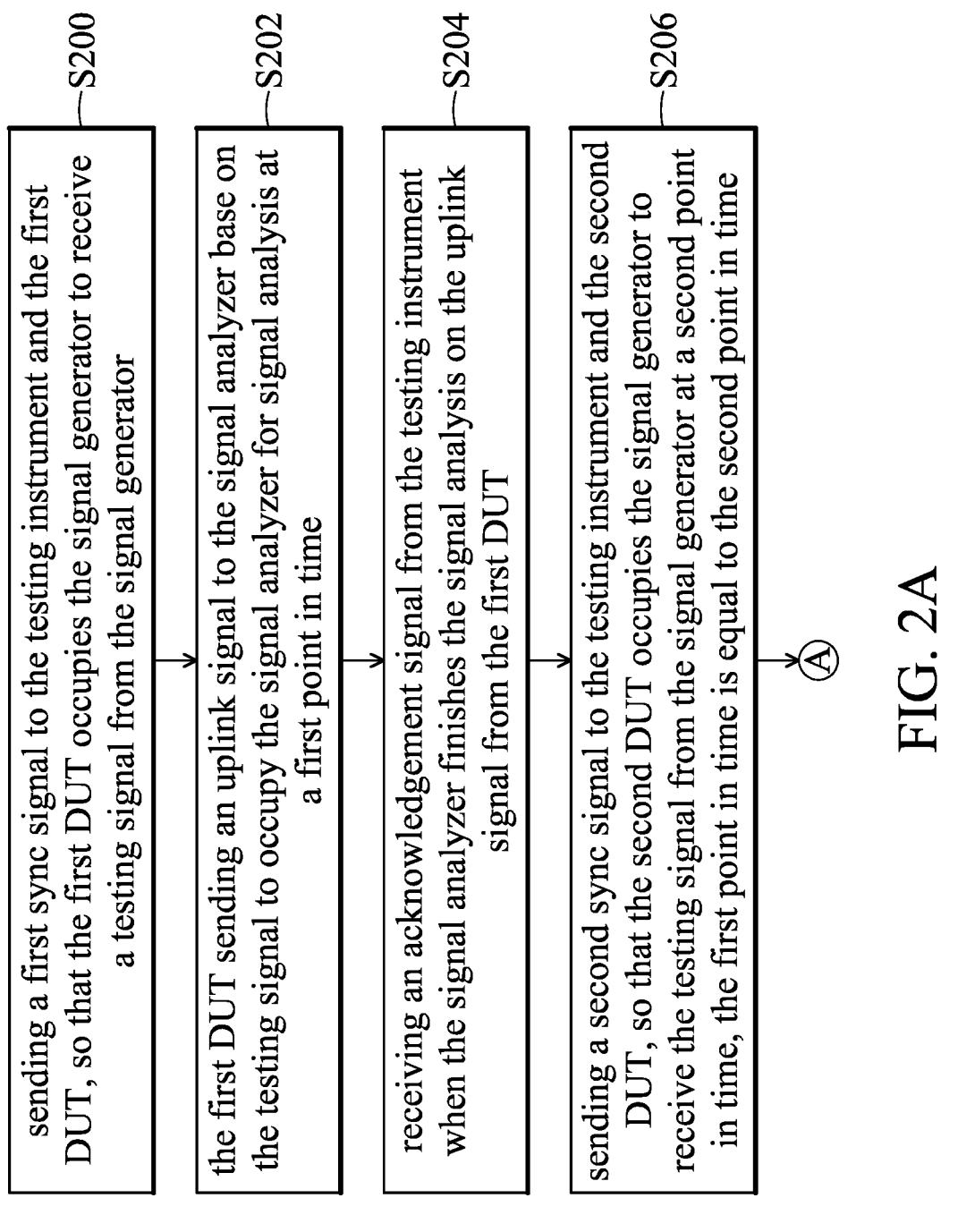

FIG. 2A and FIG. 2B are flow charts of the RF testing method for a TX test in accordance with some embodiments of the present invention. The RF testing method in FIG. 2A and FIG. 2B is applied between a testing instrument and multiple DUTs at least including a first DUT and a second DUT. The testing instrument includes a signal generator and a signal analyzer. As shown in FIG. 2A, the RF testing method includes the stages detailed in the following paragraph. A first sync signal is sent to the testing instrument and the first DUT, so that the first DUT occupies the signal generator to receive a testing signal from the signal generator (step S200). Step S200 is performed during time point t1 and time point t3 in FIG. 1. The first DUT sends an uplink signal to the signal analyzer based on the testing signal to occupy the signal analyzer for signal analysis at a first point in time (step S202). The step S202 is performed during time point t3 and time point t5 in FIG. 1. An acknowledgement signal from the testing instrument is receive when the signal analyzer finishes the signal analysis on the uplink signal from the first DUT (step S204). The step 204 is performed at time point t5 in FIG. 1. A second sync signal is sent to the testing instrument and the second DUT, so that the second DUT occupies the signal generator to receive the testing signal from the signal generator at a second point in time, the first point in time is parallel to the second point in time (step S206). Step S206 is performed during time point t3 and time point t4 in FIG. 1.

As shown in FIG. 2B, the second DUT sends the uplink signal to the signal analyzer based on the testing signal to occupy the signal analyzer for signal analysis (step S208).

Step S208 is performed during time point t5 and time point t7 in FIG. 1. An acknowledgement signal is received from the testing instrument when the signal analyzer finishes the signal analysis on the uplink signal from the second DUT (step S210). Step S210 is performed at time point t7 in FIG. 1. The TX test of the first DUT and the second DUT is finished when the number of acknowledgement signals matches the number of multiple DUTs (step S212). Step S212 is performed at time point t11 in FIG. 1.

Figure 3:
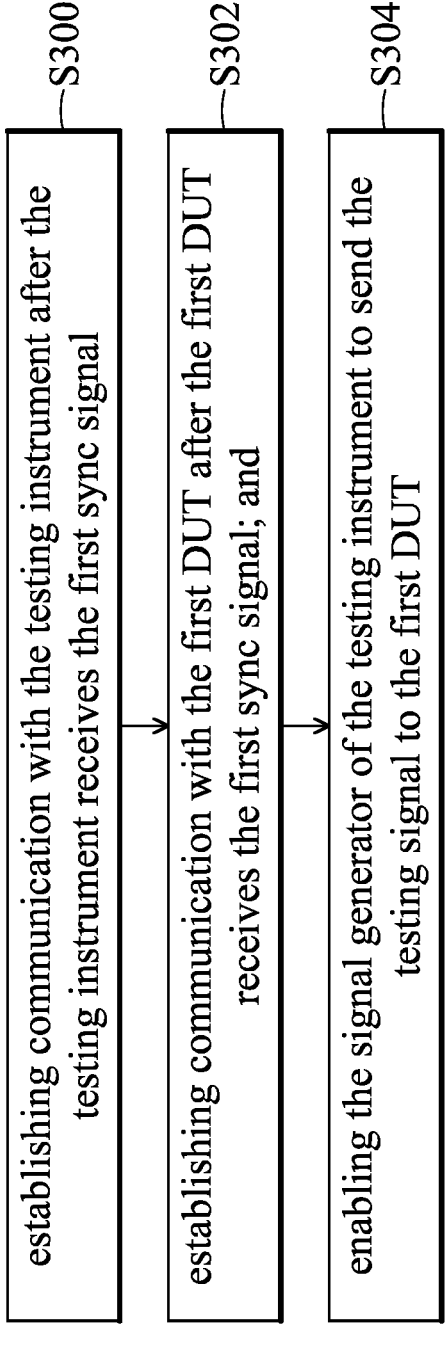
FIG. 3 is a detail flow chart of step S200 in FIG. 2A in accordance with some embodiments of the present invention.

FIG. 3 is a detail flow chart of step S200 in FIG. 2A in accordance with some embodiments of the present invention. As shown in FIG. 3, step S200 in FIG. 2A includes the stages detailed in the following paragraph. Communication with the testing instrument is established after the testing instrument receives the first sync signal (step S300). Step S300 is performed during time point t1 and time point t2 in FIG. 1. Communication with the first DUT is established after the first DUT receives the first sync signal (step S302). Step S302 is performed during time point t1 and time point t2 in FIG. 1. The signal generator of the testing instrument is enabled to send the testing signal to the first DUT (step S304). Step S304 is performed during time point t2 and time point t3 in FIG. 1.

FIG. 4 is a flow chart of the RF testing method for a RX test in accordance with some embodiments of the present invention. As shown in FIG. 4, the RF testing method includes the stages detailed in the following paragraph. A first sync signal is sent to the testing instrument and both the first DUT and the second DUT (step S400). Step S400 is performed at time point t11 in FIG. 1. In some embodiments, the signal generator of the testing instrument is enabled (for example, by the host device) to send the downlink signal to both the first DUT and the second DUT in step S400. The testing instrument sends a downlink signal to both the first DUT and the second DUT (step S402). Step S402 is performed during time point t11 to time point t12 in FIG. 1. The first DUT and the second DUT process the downlink signal from the testing instrument (step S404). Step S404 is performed during time point t11 to time point t12 in FIG. 1. Acknowledgement signals are received from both the first DUT and the second DUT (step S406). Step S400 is performed at time point t12 in FIG. 1. The RX test of the first DUT and the second DUT is finished when the number of acknowledgement signals matches the number of multiple DUTs (step S408). Step S408 is performed at time point t18 in FIG. 1.

Figure 5:
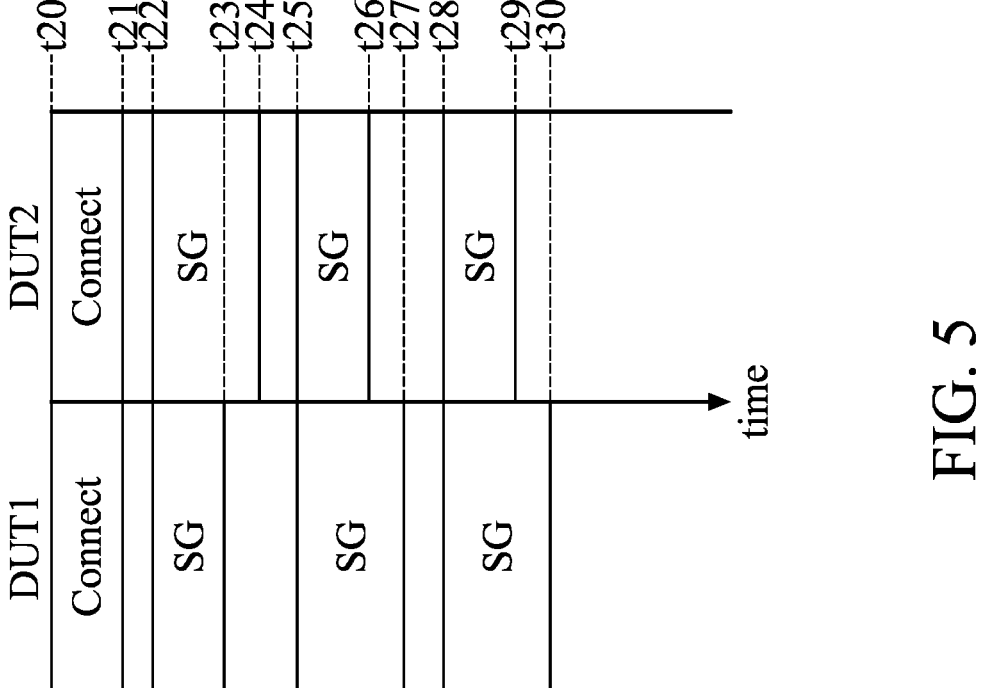
FIG. 5 is a timing sequence diagram of the RF testing method for the RX test in accordance with some embodiments of the present invention.

FIG. 5 is a timing sequence diagram of the RF testing method for the RX test in accordance with some embodiments of the present invention. The scenario of FIG. 5 is the same as that of FIG. 1. As shown in FIG. 5, at time point t20, the host device detects that the device DUT1 and the device DUT2 are attached. Therefore, during time point t20 to time point t21, the host device establishes communication with the device DUT1, the device DUT2, and the testing instrument. In some embodiments, the host device establishes communication with the testing instrument before time point t20, but the present invention is not limited thereto. At time point t22, the host device sends a first sync signal to the testing instrument and both the device DUT1 and the device DUT2. After receiving the first sync signal from the host device, the signal generator of the testing instrument sends a downlink signal to both the device DUT1 and the device DUT2. In some embodiments, the fifth sync signal includes frequency information of the downlink signal from the testing instrument during time point t22 and time point t24. In some embodiments of FIG. 5, the device DUT1 finishes processing the downlink signal at time point t23. The device DUT2 finishes processing the downlink signal at time point t24. In some embodiments, even if the host device receives the acknowledgement signal from the device DUT1 when the device DUT1 finish processing the downlink signal from the testing instrument at time point t23, the host device cannot send another sync signal to the testing instrument and both the device DUT1 and the device DUT2 at time point t23. That is, the host device has not received the acknowledgement signal from the device DUT2 yet. Once the host device receives the acknowledgement signal from the device DUT2 at time point t24, the host device sends a second sync signal to the testing instrument and both the device DUT1 and the device DUT2 at time point t25 or after time point t24.

In some embodiments, the time interval between time point t24 and time point t25 may be a time delay setting by the host device, but the present invention is not limited thereto. At time point t25, after receiving the first sync signal from the host device, the signal generator of the testing instrument sends the downlink signal to both the device DUT1 and the device DUT2. In some embodiments, the second sync signal includes frequency information of the downlink signal from the testing instrument during time point t25 and time point t27. In some embodiments of FIG. 5, the device DUT1 finishes processing the downlink signal at time point t27. The device DUT2 finishes processing the downlink signal at time point t26. In some embodiments, even if the host device receives the acknowledgement signal from the device DUT2 when the device DUT2 finish processing the downlink signal from the testing instrument at time point t26, the host device cannot send another sync signal to the testing instrument and both the device DUT1 and the device DUT2 at time point t26. That is, the host device has not received the acknowledgement signal from the device DUT1 yet. Once the host device receives the acknowledgement signal from the device DUT1 at time point t27, the host device sends a third sync signal to the testing instrument and both the device DUT1 and the device DUT2 at time point t28 or after time point t27.

In some embodiments, the time interval between time point t27 and time point t28 may be a time delay setting by the host device, but the present invention is not limited thereto. At time point t28, after receiving the third sync signal from the host device, the signal generator of the testing instrument sends the downlink signal to both the device DUT1 and the device DUT2. In some embodiments, the third sync signal includes frequency information of the downlink signal from the testing instrument during time point t28 and time point t30. In some embodiments of FIG. 5, the device DUT1 finishes processing the downlink signal at time point t30. The device DUT2 finishes processing the downlink signal at time point t29. In some embodiments, even if the host device receives the acknowledgement signal from the device DUT2 when the device DUT2 finish processing the downlink signal from the testing instrument at time point t29, the host device cannot send another sync signal to the testing instrument and both the device DUT1 and the device DUT2 at time point t29. That is, the host device has not received the acknowledgement signal from the device DUT1 yet. Once the host device receives the acknowledgement signal from the device DUT1 at time point t30, the host device sends a third sync signal to the testing instrument and both the device DUT1 and the device DUT2 after time point t30. In some embodiments, the frequency information of the downlink signals included in the first sync signal, the second sync signal, and the third sync signal are different from each other, but the present invention is not limited thereto.

Figure 6:
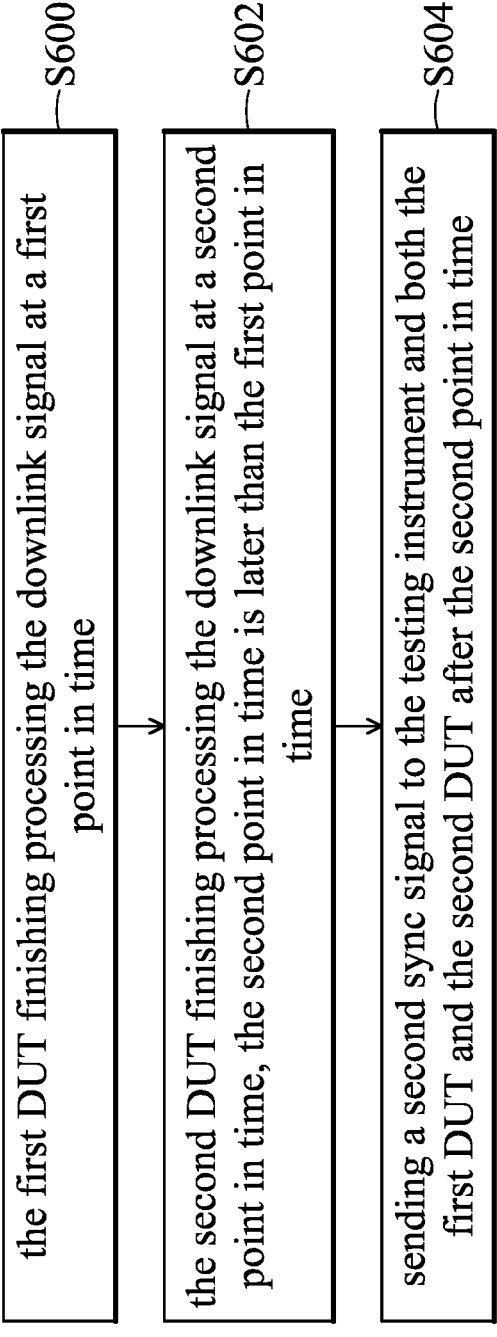
FIG. 6 is a flow chart of the RF testing method for the RX test in FIG. 5 in accordance with some embodiments of the present invention.

FIG. 6 is a flow chart of the RF testing method for the RX test in FIG. 5 in accordance with some embodiments of the present invention. As shown in FIG. 6, the RF testing method includes the stages detailed in the following paragraph. The first DUT finishes processing the downlink signal at a first point in time (step S600). Step S600 is performed at time point t23 in FIG. 5. The second DUT finishs processing the downlink signal at a second point in time, the second point in time is later than the first point in time (step S602). Step S602 is performed at time point t24 in FIG. 5. A second sync signal is sent to the testing instrument and both the first DUT and the second DUT after the second point in time (step S604). Step S604 is performed after time point t24 in FIG. 5.

Figure 7:
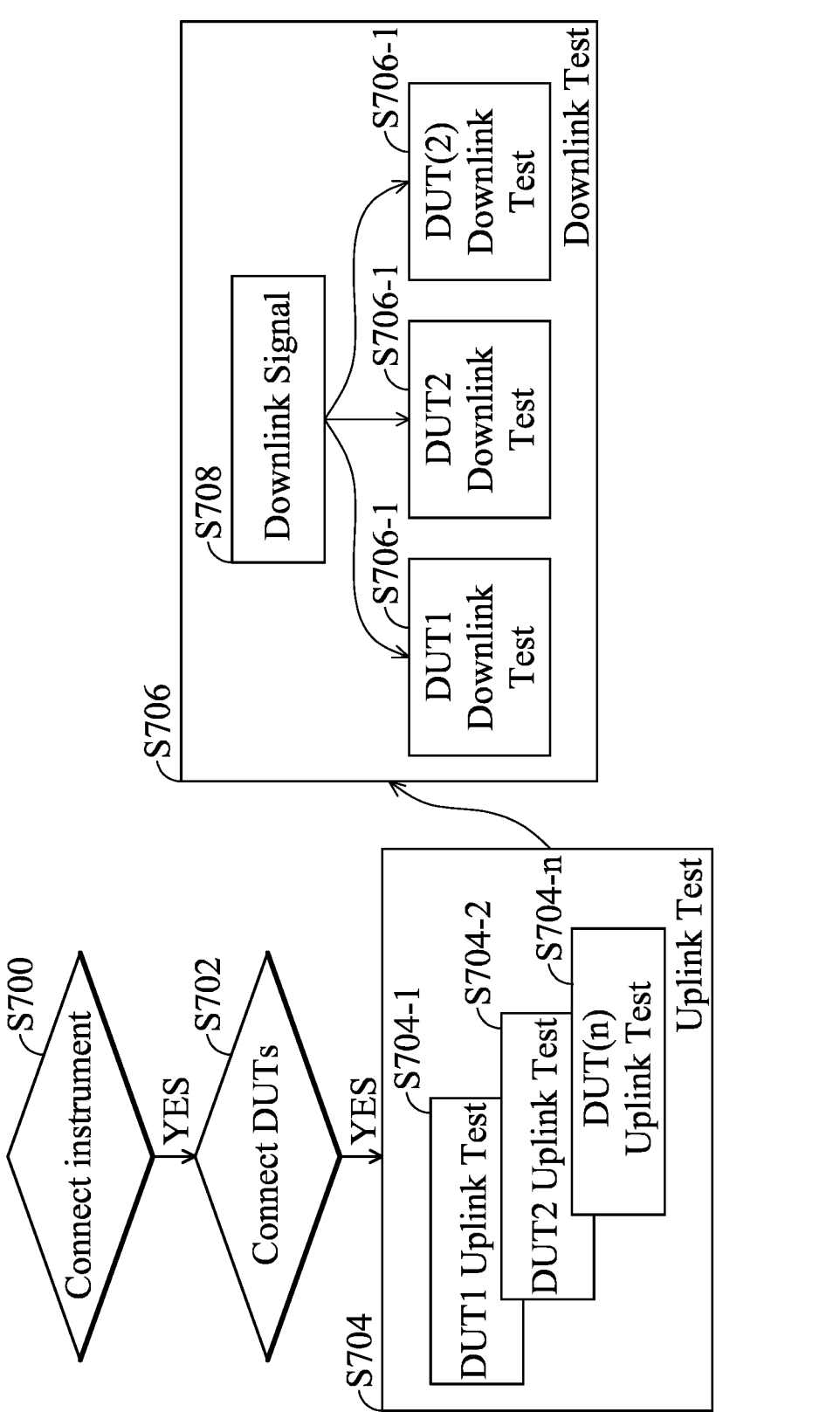
FIG. 7 is a flow chart of the RF testing method in accordance with some embodiments of the present invention.

FIG. 7 is a flow chart of the RF testing method in accordance with some embodiments of the present invention. The RF testing method in FIG. 7 is applied on multiple DUTs including n DUTs, a testing instrument, and a host device. In some embodiments, n is a positive integer larger than 2, but the present invention is not limited thereto. As shown in FIG. 7, the host device first connects the testing instrument in step S700. If the communication with the testing instrument is success ("YES" in step S700), the host device connects the multiple DUTs in step S702. If the communications with the multiple DUTs are success ("YES" in step S702), the host device performs the uplink test (that is, the TX test) on the multiple DUTs. For example, the host device performs the uplink test on the first DUT in step S704-1, performs the uplink test on the second DUT in step S704-2, and performs the uplink test on the nth DUT in step S704-n. In some embodiments, once one or more DUTs are failed during the uplink test, the one or more DUTs may be retested before the end of the uplink test in step S704. After the uplink test in step S704 is finished, the host device performs the downlink test (that is, the RX test) on the multiple DUTs. For example, the host device performs the downlink test on the first DUT in step S706-1, performs the downlink test on the second DUT in step S706-2, and performs the downlink test on the nth DUT in step S706-n in parallel.

Figure 8:
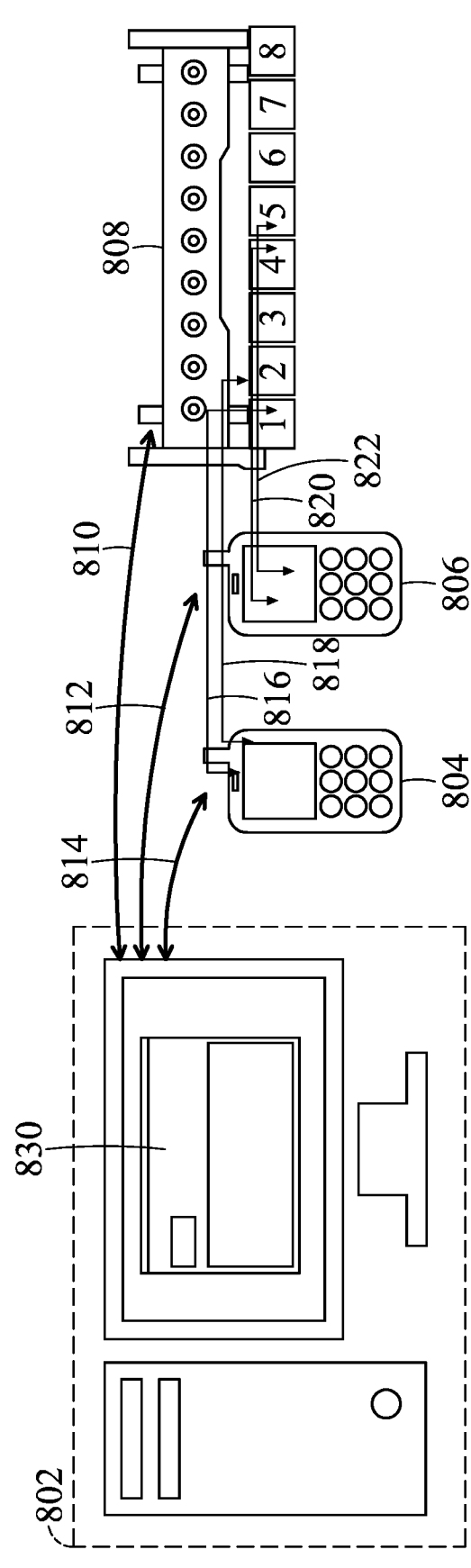
FIG. 8 is a schematic diagram of a testing system 800 in accordance with some embodiments of the present invention.

FIG. 8 is a schematic diagram of a testing system 800 in accordance with some embodiments of the present invention. As shown in FIG. 8, the testing system 800 includes a host device 802, a DUT 804, a DUT 806, and a testing instrument 808. In some embodiments, the host device 802 is electrically connected to the DUT 804, the DUT 806, and the testing instrument 808. For example, the host device 802 is electrically connected to the DUT 804 through a transmission line 814. The host device 802 is electrically connected to the DUT 806 through a transmission line 812. The host device 802 is electrically connected to the testing instrument 808 through a transmission line 810. In some embodiments, the transmission lines 812, and 814 are universal serial bus (USB) lines, but the present invention is not limited thereto. The transmission line 810 is a universal asynchronous receiver/transmitter (UART) line, but the present invention is not limited thereto.

In some embodiments, the host device 802 is, for example, a desktop, a laptop, and a server, but the present invention is not limited thereto. In some embodiments, the host device 802 includes a processor to execute a testing program for controlling the testing instrument 808, the DUT 804, and the DUT 806 to complete the TX test and the RX test. The DUT 804 and the DUT 806 are electronic devices with the function of receiving and transmitting RF signals, for example, smart phones and tablets, but the present invention is not limited thereto. The testing instrument 808 is electrically connected to the DUT 804 and the DUT 806 through coaxial cables, but the present invention is not limited thereto. In some embodiments of FIG. 8, the DUT 804 is electrically connected to the testing instrument 808 through a coaxial cable 816 for the TX test. The coaxial cable 816 is electrically connected to a first port 1 of the testing instrument 808. The DUT 804 is electrically connected to the testing instrument 808 through a coaxial cable 818 for the RX test. The coaxial cable 818 is electrically connected to a second port 2 of the testing instrument 808. Furthermore, the DUT 806 is electrically connected to the testing instrument 808 through a coaxial cable 820 for the TX test. The coaxial cable 820 is electrically connected to a fourth port 4 of the testing instrument 808. The DUT 806 is electrically connected to the testing instrument 808 through a coaxial cable 822 for the RX test. The coaxial cable 822 is electrically connected to a fifth port 5 of the testing instrument 808.

The testing instrument 808 is able to send downlink signals to the DUT 804 and the DUT 806 for the RX test, and receive uplink signals from the DUT 804 and the DUT 806 for the TX test. In some embodiments, the testing instrument includes a signal generator and a signal analyzer (both not shown). In some embodiments, for the TX test, the host device 802 sends a first sync signal to the testing instrument 808 and the DUT 804, so that the DUT 804 occupies the signal generator to receive a testing signal from the signal generator. The DUT 804 sends an uplink signal to the signal analyzer based on the testing signal to occupy the signal analyzer for signal analysis at a first point in time. The host device 802 sends a second sync signal to the testing instrument 808 and the DUT 806, so that the DUT 806 occupies the signal generator to receive the testing signal from the signal generator at a second point in time. The first point in time is parallel to the second point in time. Furthermore, the DUT 806 sends the uplink signal to the signal analyzer based on the testing signal to occupy the signal analyzer for signal analysis at a third point in time. The host device 802 sends a third sync signal to the testing instrument 808 and the DUT 804, so that the DUT 804 occupies the signal generator to receive the testing signal from the signal generator at a fourth point in time. The third point in time is parallel to the fourth point in time, and the third point in time is later than the first point in time.

In some embodiments, the testing instrument 808 sends a first acknowledgement signal when the signal analysis of the uplink signal from the DUT 804 is pass. The testing instrument 808 sends a second acknowledgement signal when the signal analysis of the uplink signal from the DUT 806 is pass. The first sync signal includes frequency information of the uplink signal from the DUT 804, and the second sync signal includes frequency information of the uplink signal from the DUT 806. In some embodiments, when the signal analysis of the uplink signal from the DUT 804 is failed, the host device 802 sends a fourth sync signal to the testing instrument 808 and the DUT 804 after the signal analysis of the uplink signal from the DUT 806 is pass.

In some embodiments, the host device 802 receives acknowledgement signals from the testing instrument 808 when the signal analyzer finishes the signal analysis on uplink signals from the DUT 804 and the DUT 806. The host device counts the number of acknowledgement signals. The host device 802 finishes the TX test of the DUT 804 and the DUT 806 when the number of acknowledgement signals matches the number of multiple DUTs.

In some embodiments, for RX test, the host device 802 sends a fifth sync signal to the testing instrument 808 and both the DUT 804 and the DUT 806. The testing instrument 808 sends a downlink signal to both the DUT 804 and the DUT 806. The DUT 804 and the DUT 806 process the downlink signal from the testing instrument 808. The host device 802 receives an acknowledgement signal from both the DUT 804 and the DUT 806. In some embodiments, the DUT 804 finishes processing the downlink signal at a fifth time point. The DUT 806 finishes processing the downlink signal at a sixth time point, the sixth time point is later than the fifth time point. The host device 802 sends a sixth sync signal to the testing instrument 808 and both the DUT 804 and the DUT 806 after the sixth time point.

In some embodiments, the host device 802 receives the acknowledgement signals from the DUT 804 and the DUT 806 when the DUT 804 and the DUT 806 finish processing the downlink signal from the testing instrument 808. The host device 802 counts the number of acknowledgement signals. The host device 802 finishes the RX test of the DUT 804 and the DUT 806 when the number of acknowledgement signals matches the number of multiple DUTs.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An RF testing method for a TX test, applied between a testing instrument and multiple devices under test (DUTs) at least comprising a first DUT and a second DUT, wherein the testing instrument comprises a signal generator and a signal analyzer, the method comprising:

sending a first sync signal to the testing instrument and the first DUT, so that the first DUT occupies the signal generator to receive a testing signal from the signal generator;

the first DUT sending an uplink signal to the signal analyzer based on the testing signal to occupy the signal analyzer for signal analysis at a first point in time; and sending a second sync signal to the testing instrument and the second DUT, so that the second DUT occupies the signal generator to receive the testing signal from the signal generator at a second point in time;

wherein the first point in time is parallel to the second point in time.

2. The RF testing method as claimed in claim 1, further comprising:

the second DUT sending the uplink signal to the signal analyzer based on the testing signal to occupy the signal analyzer for signal analysis at a third point in time; and sending a third sync signal to the testing instrument and the first DUT, so that the first DUT occupies the signal generator to receive the testing signal from the signal generator at a fourth point in time;

wherein the third point in time is parallel to the fourth point in time, and the third point in time is later than the first point in time.

3. The RF testing method as claimed in claim 1, wherein the first sync signal comprises frequency information of the uplink signal from the first DUT.

4. The RF testing method as claimed in claim 2, wherein the second sync signal comprises frequency information of the uplink signal from the second DUT.

5. The RF testing method as claimed in claim 2, further comprising:

the testing instrument sending a first acknowledgement signal when the signal analysis of the uplink signal from the first DUT is pass; and the testing instrument sending a second acknowledgement signal when the signal analysis of the uplink signal from the second DUT is pass.

6. The RF testing method as claimed in claim 5, further comprising:

sending a fourth sync signal to the testing instrument and the first DUT after the signal analysis of the uplink signal from the second DUT is pass when the signal analysis of the uplink signal from the first DUT is failed.

7. The RF testing method as claimed in claim 1, further comprising:

receiving acknowledgement signals from the testing instrument when the signal analyzer finishes the signal analysis on uplink signals from the multiple DUTs;

counting the number of the acknowledgement signals;

finishing the TX test of the multiple DUTs when the number of the acknowledgement signals matches the number of the multiple DUTs.

8. The RF testing method as claimed in claim 1, wherein the step of sending the first sync signal to the testing instrument and the first DUT, comprising:

establishing communication with the testing instrument after the testing instrument receives the first sync signal;

establishing communication with the first DUT after the first DUT receives the first sync signal; and enabling the signal generator of the testing instrument to send the testing signal to the first DUT.

9. An RF testing method for an RX test, applied between a testing instrument and multiple devices under test (DUTs) at least comprising a first DUT and a second DUT, wherein the testing instrument comprises a signal generator and a signal analyzer, the method comprising:

sending a first sync signal to the testing instrument and both the first DUT and the second DUT; and the testing instrument sending a downlink signal to both the first DUT and the second DUT;

the first DUT and the second DUT processing the downlink signal from the testing instrument; and receiving acknowledgement signals from both the first DUT and the second DUT.

10. The RF testing method as claimed in claim 9, further comprising:

receiving the acknowledgement signals from the multiple DUTs when the multiple DUTs finish processing the downlink signal from the testing instrument;

counting the number of the acknowledgement signals; and finishing the RX test of the multiple DUTs when the number of the acknowledgement signals matches the number of the multiple DUTs.

11. The RF testing method as claimed in claim 9, further comprising:

the first DUT finishing processing the downlink signal at a first point in time;

the second DUT finishing processing the downlink signal at a second point in time; wherein the second point in time is later than the first point in time; and sending a second sync signal to the testing instrument and both the first DUT and the second DUT after the second point in time.

12. The RF testing method as claimed in claim 9, wherein the step of sending the first sync signal to the testing instrument and both the first DUT and the second DUT, comprising:

establishing communication with the testing instrument after the testing instrument receives the first sync signal;

establishing communication with the first DUT after the first DUT receives the first sync signal; and establishing communication with the second DUT after the second DUT receives the first sync signal; and enabling the signal generator of the testing instrument to send the downlink signal to both the first DUT and the second DUT.

13. The RF testing method as claimed in claim 9, wherein the first sync signal comprises frequency information of the downlink signal from the testing instrument.

14. A testing system, comprising:

a testing instrument, comprising a signal generator and a signal analyzer;

multiple devices under test (DUTs), at least comprising a first DUT and a second DUT, and electrically connected to the testing instrument;

a host device, electrically connected to the testing instrument and the multiple DUTs;

wherein, the host device sends a first sync signal to the testing instrument and the first DUT, so that the first DUT occupies the signal generator to receive a testing signal from the signal generator;

the first DUT sends an uplink signal to the signal analyzer based on the testing signal to occupy the signal analyzer for signal analysis at a first point in time;

the host device sends a second sync signal to the testing instrument and the second DUT, so that the second DUT occupies the signal generator to receive the testing signal from the signal generator at a second point in time; and the first point in time is parallel to the second point in time.

15. The testing system as claimed in claim 14, wherein, the second DUT sends the uplink signal to the signal analyzer based on the testing signal to occupy the signal analyzer for signal analysis at a third point in time;

the host device sends a third sync signal to the testing instrument and the first DUT, so that the first DUT occupies the signal generator to receive the testing signal from the signal generator at a fourth point in time; and the third point in time is parallel to the fourth point in time, and the third point in time is later than the first point in time.

16. The testing system as claimed in claim 15, wherein the testing instrument sends a first acknowledgement signal when the signal analysis of the uplink signal from the first DUT is pass; and the testing instrument sends a second acknowledgement signal when the signal analysis of the uplink signal from the second DUT is pass.

17. The testing system as claimed in claim 15, wherein the first sync signal comprises frequency information of the uplink signal from the first DUT, and the second sync signal comprises frequency information of the uplink signal from the second DUT.

18. The testing system as claimed in claim 15, wherein when the signal analysis of the uplink signal from the first DUT is failed, the host device sends a fourth sync signal to the testing instrument and the first DUT after the signal analysis of the uplink signal from the second DUT is pass.

19. The testing system as claimed in claim 14, wherein, the host device sends a fifth sync signal to the testing instrument and both the first DUT and the second DUT;

the testing instrument sends a downlink signal to both the first DUT and the second DUT;

the first DUT and the second DUT process the downlink signal from the testing instrument; and the host device receives an acknowledgement signal from both the first DUT and the second DUT.

20. The testing system as claimed in claim 19, wherein, the first DUT finishes processing the downlink signal at a fifth time point;

the second DUT finishes processing the downlink signal at a sixth time point, the sixth time point is later than the fifth time point; and the host device sends a sixth sync signal to the testing instrument and both the first DUT and the second DUT after the sixth time point.

* * * * *